(12) United States Patent
Brandl et al.

(10) Patent No.: US 11,534,868 B2
(45) Date of Patent: Dec. 27, 2022

(54) DEVICE AND METHOD FOR SEPARATING A TEMPORARILY BONDED SUBSTRATE STACK

(71) Applicant: EV Group E. Thallner GmbH, St. Florian am Inn (AT)

(72) Inventors: Elisabeth Brandl, Wels (AT); Boris Povazay, Vienna (AT); Thomas Uhrmann, Thymau (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 399 days.

(21) Appl. No.: 16/644,283

(22) PCT Filed: Sep. 12, 2017

(86) PCT No.: PCT/EP2017/072869
§ 371 (c)(1),
(2) Date: Mar. 4, 2020

(87) PCT Pub. No.: WO2019/052634
PCT Pub. Date: Mar. 21, 2019

(65) Prior Publication Data
US 2021/0060710 A1     Mar. 4, 2021

(51) Int. Cl.
*B29C 63/00* (2006.01)
*B23K 26/53* (2014.01)
(Continued)

(52) U.S. Cl.
CPC .......... *B23K 26/53* (2015.10); *B23K 26/0006* (2013.01); *B23K 26/046* (2013.01);
(Continued)

(58) Field of Classification Search
CPC .............. B23K 26/0006; B23K 26/046; B23K 26/0622; B23K 26/082; B23K 26/0861; B23K 26/53; B32B 43/006
See application file for complete search history.

(56) References Cited

U.S. PATENT DOCUMENTS

| 2003/0032210 A1* | 2/2003 | Takayama ........... H01L 27/1248 438/455 |
| 2009/0218560 A1 | 9/2009 | Flaim et al. |

(Continued)

FOREIGN PATENT DOCUMENTS

| CN | 105977194 A | 9/2016 |
| DE | 102015224321 A1 | 6/2016 |

(Continued)

OTHER PUBLICATIONS

Japanese Office Action (and its English-language translation) dated Mar. 7, 2022 from corresponding Japanese Patent Application No. 2020-512805.

(Continued)

*Primary Examiner* — Brook Kebede
(74) *Attorney, Agent, or Firm* — Kusner & Jaffe

(57) ABSTRACT

A method for separating a temporarily bonded substrate stack by bombardment of a joining layer of the substrate stack by means of laser beams emitted by a laser, characterised in that laser beams of the laser reflected and/or transmitted at the temporarily bonded substrate stack are detected during the bombardment of the joining layer with the laser beams. The invention also relates to a corresponding device.

10 Claims, 3 Drawing Sheets

(51) Int. Cl.
  *B23K 26/0622* (2014.01)
  *B23K 26/082* (2014.01)
  *B23K 26/00* (2014.01)
  *B23K 26/046* (2014.01)
  *B23K 26/08* (2014.01)
  *B32B 43/00* (2006.01)
  *B23K 101/40* (2006.01)

(52) U.S. Cl.
  CPC ........ *B23K 26/0622* (2015.10); *B23K 26/082* (2015.10); *B23K 26/0861* (2013.01); *B32B 43/006* (2013.01); *B23K 2101/40* (2018.08); *B32B 2310/0843* (2013.01)

(56) References Cited

U.S. PATENT DOCUMENTS

| | | |
|---|---|---|
| 2011/0132549 A1 | 6/2011 | Sercel et al. |
| 2013/0036928 A1 | 2/2013 | Rogers et al. |
| 2014/0251533 A1* | 9/2014 | Lim .................... H01L 21/6835 156/247 |
| 2016/0329233 A1* | 11/2016 | Andry ................ H01L 21/67092 |
| 2016/0336233 A1* | 11/2016 | Yonehara ............... B42D 25/00 |

FOREIGN PATENT DOCUMENTS

| | | |
|---|---|---|
| JP | 2004-146790 A | 5/2004 |
| JP | 2004-193533 A | 7/2004 |
| JP | 2011-83795 A | 4/2011 |
| JP | 2011512256 A | 4/2011 |
| JP | 2014-130910 A | 7/2014 |
| JP | 2016-111143 A | 6/2016 |
| WO | WO 2009/104886 A2 | 8/2009 |
| WO | WO 2016/112975 A1 | 7/2016 |

OTHER PUBLICATIONS

International Search Report from corresponding International Patent Application No. PCT/EP2017/072869, dated Jun. 18, 2018.
Bing et al., "Feasibility Study of Si Handler Debonding by Laser Release," 2016 IEEE 66th Electronic Components and Technology Conference, May 31, 2016, pp. 1671-1677.
Office Action issued in related Korean Patent Application No. 10-2020-7006356 dated Jun. 21, 2022 along with the English-language machine translation.

* cited by examiner

DEVICE AND METHOD FOR SEPARATING A TEMPORARILY BONDED SUBSTRATE STACK

FIELD OF THE INVENTION

The present invention relates to a method and device for separating a temporarily bonded substrate stack according to the independent claim(s).

BACKGROUND OF THE INVENTION

There are countless methods in the prior art for joining substrates to one another. The purpose and aim of the joining is either permanent or temporary substrate stacks. If the substrates are joined temporarily, in particular by means of a bonding layer, they are again separated from one another at another point in the process chain. The separation process is known as debonding. One of the latest and most important methods for separating substrate stacks is laser debonding. In the case of laser debonding, a focused laser beam with high power and defined wavelength scans the substrate stack interface region of two substrates and leads to a separation of the two substrates from one another as a result of the high energy input into the bonding layer.

An evaluation of the debonding process takes place in the prior art after the separation of the substrates from one another, for example by an optical assessment. The surface roughness and the surface quality, for example, are examined.

A problem in the prior art is that, as a result of the bombardment with laser beams, destruction of the substrates, in particular of expensive functional components of the substrates, can take place.

SUMMARY OF THE INVENTION

The problem addressed by the present invention is to overcome the drawbacks of the prior art and in particular to ensure a separation of the substrate stack in as destruction-free manner as possible, but at the same time in an effective manner.

This problem is solved by the subject-matters of the coordinated claims and the inventive ideas disclosed below. Advantageous developments of the invention are specified in the sub-claims. All combinations of at least two features stated in the description, the claims and/or the drawings also fall within the scope of the invention. In the case of the value ranges, values lying within the stated limits are also deemed to be disclosed as limiting values and can be claimed in any combination.

In particular, the invention shows that damage can be avoided by evaluating the correct laser parameters for the separation of the substrate stacks during the separation, but at the same time effective separation is enabled. On the one hand, the introduced energy of the laser beams must be sufficiently high for the at least partial destruction of the temporary bonding layer (joining layer) in order to bring about an efficient separation. On the other hand, the introduced laser power must not exceed a power which would destroy the substrate surfaces on which functional components in particular may be present. In other words, the introduced energy of the laser beams leads to the at least partial weakening (preferable complete reduction) of the bonding strength of the temporary bonding layer. Since, as a result of the irradiation, the targeted energy input and the energy conversion takes place in the bonding layer, the in particular thermal and/or photothermal load on the functional components is minimised. For the evaluation of the correct laser parameters, reflected laser beams and/or laser beams transmitted through the substrate stack are detected, according to the invention, in particular in situ during the bombardment of the substrate stack with laser beams for the separation of the substrates of the substrate stack.

One aspect of the present invention is directed to a device and a method, with the aid of which monitoring and/or adaptation of the laser parameters and/or monitoring of the bonding layer can take place during the bombardment of the bonding layer of the substrate stack.

According to the invention, the two substrates of the substrate stack are joined together by at least one joining layer, in particular a temporary bonding layer, preferably a bonding adhesive. The use of a plurality of joining layers, in particular with different physical and/or chemical properties, would also be conceivable. In a very particular embodiment according to the invention, the different joining layers react physically and/or chemically with a different sensitivity to the photons of the laser. According to the invention, it is conceivable for the joining layer to comprise a release layer. By bombarding the release layer, the latter is changed chemically and/or physically in such a way that the adhesion between the substrates is reduced, in particular completely.

A further aspect of the present invention is directed to providing a device and a method to determine the correct or optimum laser parameters for a type of substrate stack, in order that the substrate stack can be separated in high volume manufacturing (HVM) with a high throughput and the minimal extent of control work.

The laser parameters are optimised as results from measurement series and/or as parameters of control variables. In other words, the detected measurement values such as laser beam intensity, profile shape, surface uniformity of the separated stack, homogeneity of the laser beam are compiled and/or evaluated by means of, in particular, automatic feedback loops into control/regulating units, in particular computers. The optimised control variables are then used for further debonding processes and/or measurement series.

The minimal extent of control work remaining after the aforementioned determination of the optimum laser parameters relates in particular to the in-situ measurement of the laser beam properties, wherein the radiation is directed at least partially and/or temporarily not onto the substrate stack, but directly onto a laser sensor. This permits the control of the given state of the radiation source, in particular for correct settings, ageing phenomena.

According to an advantageous embodiment of the invention, the bombardment of the joining layer (25) with the laser beams (16, 16') takes place in a scanned manner.

A scanning movement of the laser beam in scanning steps comprises one or more of the following trajectories and/or tracks:

x-y scan or saw-tooth line scanning. The laser beam illuminates the substrate stack in a coordinate direction, wherein after completion of a line the next line is illuminated in the same direction.

x-y scan with back and forth movement (meandering movement): The laser beam illuminates a line in one direction, the next line being illuminated/scanned, in particular seamlessly, in the opposite direction and so forth.

Spiral scan: The scanning movement is carried out along a spiral with identical pulse frequency and, coupled with this, with different deflection speed.

Alternative spiral scan: The scanning movement takes place along a spiral with variable pulse frequency and, coupled with this, with identical deflection speed of the scanner.

Circle-scan: In particular closed, complete circle rings are performed by means of the scanning movement.

Random-spot-scan with local limitation: The scanning movement is coupled with random processes such as a random count generator, wherein after one laser pulse the following laser pulse takes place at a distance of greater than 5 micrometres, preferably greater than 50 micrometres, particularly preferably greater than 500 micrometres, particularly preferably greater than 5 mm at a randomly calculated spot. The areas treated and untreated by laser pulse are continuously updated, so that the device selects the next spot in particular by itself at random from the number of untreated areas. An advantage of this method is the reduction of the local heat load on the substrate.

A scanning step corresponds in particular to the exposure of an irradiation area of the laser beams without a movement of the laser beams. In the case of all the mentioned scanning movements, a minimum distance between two successive scanning steps can preferably be adjusted. The minimum distance is in particular greater than the diameter of the irradiation area, preferably at least twice as great as the diameter of the irradiation area. In a further embodiment, the minimal extent of control work can be minimised, in that the laser beam strikes a defined area during the scanning of the substrate stack, in that the transmission is detected by means of the listed sensors and no additional technical measures, in particular scanner movements, are required for the measurement of the laser radiation.

According to the invention, the device is preferably set up such that not only the monitoring and/or adaptation of the laser parameters take place, but laser debonding can also be carried out with the laser beams at the same time. Existing laser debonding installations can thus be expanded to form a device according to the invention, in that detection means according to the invention are installed.

In a further embodiment, existing debonding devices can be expanded so as to be retrofitted with the measuring device according to the invention as well as the control device and method. As an independent invention, a retrofit kit is thus disclosed in order to equip existing devices from the prior art with the functionality according to the invention.

The invention describes in particular a device and a method, with the aid of which an in-situ measurement of a debonding process, in particular a laser debonding process, is enabled. The invention is based in particular on the idea of measuring, by means of at least one sensor, preferably a sensor array, the transmitted and/or reflected intensity of the laser beam coupled into the substrate stack, and of obtaining, in particular by standardisation to the input power, a conclusion as to the quality of the bombardment of the bonding layer. In particular, conclusions are drawn about the quality of the bombardment by determining the power loss.

By using sensor arrays, a locally resolved map of the entire bonding layer can in particular be generated.

The device and the method are preferably used in a transmission mode, since the positioning of the detectors at the side which lies opposite the optical system is easier to implement technically.

The transmitted and/or reflected laser power can be ascertained in-situ, in particular locally resolved. The recorded data deliver conclusions as to the effect of the laser on the bonding layer.

The thickness of a release layer according to the invention preferably lies between 0.0001 µm and 1000 µm, preferably between 0.005 µm and 500 µm, more preferably between 0.001 µm and 400 µm, most preferably between 0.05 µm and 300 µm, with utmost preference between 0.01 µm and 200 µm.

The thickness of the temporary bonding layer, in particular comprising the release layer, preferably lies between 0.001 µm and 1000 µm, more preferably between 0.005 µm and 500 µm, still more preferably between 0.01 µm and 400 µm, most preferably between 0.05 µm and 300 µm, with utmost preference between 0.1 µm and 200 µm.

Particularly in the case of laser debonding, the release layer of the temporary bonding layer is released and the separation, i.e. the debonding process, is thus carried out. In particular, chemical compounds are disassociated with the laser beams, which lead to a reduction in the adhesion. In a preferred embodiment of the debonding, the in particular adjustable laser beam triggers a direct photochemical reaction in the temporary bonding layer, which directly changes, in particular irreversibly, the bonds of the temporary bonding layer, in particular the release layer of the temporary bonding layer, so that the adhesive strength of the layer is reduced, in particular eliminated. No significant heating, in particular no heating of the substrate or the substrate stack, takes place as a result of the direct photochemical reaction. The temperature increase compared to the initial temperature of the entire substrate stack is preferably limited to less than 100° C., preferably less than 50° C., preferably less than 25° C., particularly preferably less than 15° C. When mention is made of a temporary bonding layer, a joining layer is also conceivable as an alternative.

In a further preferred embodiment of the debonder, the in particular adjustable laser radiation triggers a photothermal reaction in the temporary bonding layer, which changes, in particular irreversibly, the bonds of the temporary bonding layer, in particular of the release layer of the temporary bonding layer, so that the adhesive strength of the layer is reduced, in particular eliminated. A sufficiently high local heating takes place to reduce the adhesive strength. The local heating in the laser spot is in particular less than 2000° C., preferably less than 1500° C., still more preferably less than 1000° C., most preferably less than 500° C., with utmost preference less than 250° C. The substrate stack is heated overall by less than 100° C., preferably less than 50° C., particularly preferably less than 25° C.

The reaction temperature, measured overall on the substrate in the device, is in particular between 0° C. and 300° C., preferably between 10° C. and 200° C., particularly preferably between room temperature/atmospheric temperature and 40° C.

In a further preferred embodiment of the debonder, laser beam properties, in particular wavelength, pulse duration, homogeneity, beam cross-section and/or luminous energy, can be adjusted such that a photochemical or a photothermal reaction or a mixed form of the two types of reaction takes place.

In particular, photochemical and/or photothermal reactions can lead in the case of organic materials to a complete carbonisation of the organic material. This is understood to mean the chemical removal of all the atoms with the exception of carbon. The carbon, which arises as a layer as a reaction product of the carbonisation, has a high absorbance especially for the wavelength ranges of relevance according to the invention. An attempt is therefore preferably made to adjust the parameters according to the invention in such a way that as little carbonisation as possible, preferably no carbonisation, takes place and as a result a carbon-containing, non-transparent layer, in particular a layer of soot, does not arise.

The device according to the invention comprises in particular an optical system, with the aid of which laser beams generated by a laser can be directed onto a substrate stack and their parameters (in particular their power) are measured in the reflection and/or transmission mode. The optical system is preferably connected statically to a base by means of a stand. The substrate stacks are fixed on a substrate holder.

The substrate holder preferably comprises fixing means. The fixing means serve to secure the substrates. The fixing means are selected in particular from one or more of the following fixing means:

mechanical fixing means, in particular clamps, and/or vacuum fixing means, in particular with individually controllable vacuum tracks and/or vacuum tracks which can be connected to one another, and/or electrical fixing means, in particular electrostatic fixing means, and/or magnetic fixing means, and/or adhesive fixing means, in particular gel-pak fixings and/or fixing means with adhesive, in particular controllable, surfaces.

The fixing means can be controlled in particular electronically by a preferably software-based control unit. Vacuum fixing is the preferred type of fixing. Vacuum fixing preferably comprises a plurality of vacuum tracks, which exit at the surface of the sample holder. The vacuum tracks can preferably be controlled individually. In an application that is technically easy to implement, several vacuum tracks are combined into vacuum track segments, which can be controlled individually. They can be evacuated or flooded. Each vacuum segment is preferably independent of the other vacuum segments. The vacuum segments are preferably designed in annular form. A targeted, radial-symmetrical fixing, running in particular from the inside outwards or vice versa, or release of a substrate from the sample holder is thus enabled.

Generally, the debonding device can contain at least one control and/or regulating unit, in particular a computer, which checks and/or stores and/or processes and/or outputs and/or sets the device parameters/process parameters. In particular, all the measuring instruments in the method according to the invention can be connected to the control and/or regulating unit for information acquisition or processing or storage or outputting.

A relative movement can preferably take place between the optical system and the substrate holder. The substrate holder preferably moves, while the optical system, stand and base are arranged static.

In a particularly preferred embodiment, a relative movement between the substrate stack and the laser beam takes place by deflecting the beam in the optical system, wherein the substrate on the substrate holder and the further parts of the device are not moved with respect to one another.

Loading and unloading sequences known to the person skilled in the art are provided for the loading of the substrate stack and for the unloading of the irradiated substrate stack or the separated substrates.

With the aid of the device according to the invention, it is possible to separate at least two substrates which are part of a substrate stack by means of a laser, and simultaneously, concurrently or in at least partially overlapping periods of time to determine properties/parameters of reflected and/or transmitted laser beams, which permit a direct conclusion to be drawn regarding the debonding process. According to the invention, therefore, a control of the separation is possible during the separation in order to optimise the separation process, i.e. to carry out the separation in as damage-free and efficient a manner as possible.

In a first embodiment according to the invention, the device is preferably designed as a scanning device. A scanning device is understood to mean a device according to the invention, wherein a relative movement in an X-Y plane formed by the substrate stack takes place with respect to the optical system, in particular with respect to the laser beams directed normal to the substrate stack in a Z-direction. The laser can irradiate the entire bonding layer of the substrate stack in this case by continuous, in particular full-area scanning. At least one detector is preferably fixed statically with respect to the optical system.

In a second embodiment according to the invention, laser beams are emitted by the device, which irradiate the substrate stack over the entire area, in particular by widening the laser beams emitted from the laser by means of a lens system. The measurement of the laser beams, in particular their power, preferably takes place by means of an array of detectors, which measure the transmitted and/or reflected laser radiation as a function of position. Alternatively, a relative movement of at least one detector relative to the static substrate stack takes place in order to measure the transmitted and/or reflected laser radiation in a location-dependent manner.

The power of the laser, measured as luminous power, in particular radiation power, which can be continuously delivered to the substrate, amounts in particular to at least 5 W, preferably more than 10 W, still more preferably more than 15 W, most preferably more than 17 W, with utmost preference more than 30 W.

The preferred wavelength range of the laser lies between 100 nm-10,000 nm, preferably between 250 nm-1100 nm, still more preferably between 270 nm-430 nm, most preferably between 280 nm-380 nm, with utmost preference between 305 nm-380 nm.

In a particularly preferred embodiment, the wavelength of the laser can be adjusted and filtered by means of frequency converters, in particular acousto-optical modulators, in particular Bragg cells.

In a further preferred embodiment of the device, the laser beam contains at least one wavelength from the set of 1064 nm, 420 nm, 380 nm, 343 nm, 318 nm, 308 nm, 280 nm.

The use of laser beams with at least two wavelengths is particularly advantageous, in order in particular to carry out photochemical and photothermal processes in a combined manner in the bonding layer.

In a particularly preferred embodiment of the device, the radiation source is a diode laser.

The total energy of the laser radiation per substrate is set in particular between 0.01 mJ and 5000 kJ, preferably between 0.1 mJ and 4000 kJ, particularly preferably between 100 mJ and 2000 kJ.

The laser beam can be operated in a continuous mode or in a pulsed manner. The pulse frequency is in particular between 0.1 Hz and 300 MHz, preferably between 100 Hz and 500 kHz, particularly preferably between 10 kHz and 400 kHz, very particularly preferably between 100 kHz and 300 kHz.

The number of pulses per substrate stack, depending on the required total energy, preferably amounts to more than 1 million pulses, preferably more than 3 million pulses, particularly preferably more than 5 million pulses, very particularly preferably 6 million pulses.

The energy which strikes the substrate stack per pulse of radiation is set in particular between 0.1 nJ and 1 J, preferably between 1 nJ and 900 µJ, particularly preferably between 10 nJ and 500 µJ.

The irradiation area per pulse lies in particular between 1 µm² and 100000 µm², preferably 10000 µm² and 50000 µm², particularly preferably 1000 µm² and 40000 µm², very particularly preferably between 2500 µm² and 26000 µm².

Synonyms for the irradiation area are known to the person skilled in the art as spot size, beam spot (laser spot size).

The shape of the irradiation area is in particular circular, in other preferred embodiments elliptical, in particularly preferred embodiments rectangular.

The first embodiment according to the invention is described and represented in the following text and in the figures.

In the subsequent text of the publication, an optical system is understood to mean the set of all the optical elements with the aid of which the device according to the invention is constructed or which are used to carry out the processes according to the invention. According to the invention, one or more of the following in particular are selected as optical elements:

mirrors, in particular plane mirrors, convex mirrors or concave mirrors,
lenses, in particular
  convex lenses, in particular biconvex, planar convex or concave convex,
  concave lenses, in particular biconcave, planar concave or convex concave,
  Fresnel lenses,
prisms,
diffraction elements, in particular diffraction gratings,
telescopes.

Telescopes are understood to mean optical systems, with which the diameter and/or the focusing of the laser beam can be changed with at least two optical components.

The optical components can comprise simple lenses and/or corrected lenses such as achromatic lenses and/or apochromatic lenses as well as lens groups comprising a plurality of lenses which in particular are adjustable with respect to one another.

The substrates can have any shape, but are preferably circular. The diameter of the substrates is in particular industrially standardised. For wafers, the standard industrial diameters are 1 inch, 2 inches, 3 inches, 4 inches, 5 inches, 6 inches, 8 inches, 12 inches and 18 inches. The embodiment according to the invention, however, can in principle handle any substrate, irrespective of its diameter. The substrates are in particular constituted transparent for the laser. Preferably at least one, more preferably both substrates, are glass substrates.

In a further embodiment, the substrate stack comprises a carrier substrate transparent for the laser radiation, a non-transparent, in particular partially metallised, reflecting product substrate and the temporary bonding layer. In this case, the carrier substrate is first penetrated by the laser beam.

In a further embodiment, the substrate stack can be fixed on the substrate holder in such a way that it is not the carrier substrate, but the product substrate that is first penetrated by the laser beam.

The transmittance in the optical path at least through the carrier substrate into the joining layer, with regard to the laser used, is preferably greater than 5%, more preferably greater than 25%, still more preferably greater than 50%, still more preferably greater than 75%, with utmost preference greater than 90% for a substrate according to the invention or a substrate stack according to the invention.

The telescopes are in particular telescopes which can be switched very quickly, wherein their focal point in particular can be changed very quickly. The switching frequency for the switch between two focal points is in particular greater than 1 Hz, preferably greater than 10 Hz, still more preferably greater than 100 Hz, most preferably greater than 1000 Hz, with utmost preference greater than 10000 Hz.

The length within which the focal point can be changed is in particular greater than 0.1 mm, preferably greater than 1 mm, still more preferably greater than 5 mm, most preferably greater than 10 mm, with utmost preference greater than 20 mm.

The embodiment according to the invention can comprise a plurality of telescopes, in particular more than 1 telescope, preferably more than 2 telescopes, still more preferably more than 3 telescopes, most preferably more than 4 telescopes, with utmost preference more than 5 telescopes. The telescopes are used in particular for the dynamic magnification/demagnification of the beam shape and therefore the ablation area or irradiation area.

The adaptation of the focus permits the correct positioning of the depth of focus range corresponding to any curvature of the substrate stack that may be present. In particular, temporarily bonded substrate stacks can, especially after the product substrate has been back-thinned or otherwise treated, exhibit extreme stresses, which lead to a not inconsiderable curvature of the entire substrate stack. If the substrate stack is curved, the bonding layer with which the substrates are joined together is also curved. When scanning of all the points along the bonding layer takes place according to the invention, the depth of focus range is adapted according to the invention as a function of the position in order to obtain an optimum debonding result.

The beam can be formed by an arbitrary number and combination of optical elements. The beam shape is the geometrical sectional outline which arises when the laser beam is intersected with a plane. In particular, the geometrical sectional outline of the beam with the bonding layer is identical to the ablation area/irradiation area. Conceivable beam shapes are:

line shape
rectangular shape, in particular
  square shape
hexagonal shape
triangular shape
elliptical shape, in particular circular shape
any other shape, in particular by means of an aperture.

The intensity profiles, i.e. the course of the intensity along a direction through the beam shape, can be set arbitrarily by means of optical elements. Preferred intensity profiles are Gaussian profile
rectangular profile
triangular profile
elliptical profiles, in particular circular profiles The setting options for the beam shapes and the intensity profiles serve in particular to optimise the homogeneity. The following ideal example is cited by way of example. A laser beam with a square beam shape of 1 µm side length and a perfect rectangular intensity profile would generate, with a step size of 1 µm in the x- and y-direction with complete scanning of the area, a completely homogeneous irradiation. Since the generation of a laser beam with a perfect square beam shape and a perfect rectangular radiation profile is not possible, the homogeneity of the irradiated area is approximated by superimposing other beam shapes and/or other intensity profiles.

The beam shape defines the ablation area/irradiation area.

The ablation area, in the limiting case of a small area also referred to as an ablation point, is the sectional area of the laser beam with the part of the bonding layer that is destroyed and/or in particular irreversibly changed by the laser beam. The shape and/or size of the ablation area has in particular a direct influence on the power density of the laser in this area and can thus be used to control the ablation in a targeted manner.

The size of the ablation area can be set in particular by means of optical elements, preferably by telescopes. Also conceivable is a relative displacement between the substrate stack and the optical system, as long as the laser directed onto the substrate stack is not parallelised, i.e. convergent or divergent. In particular, a second telescope can be used for an affine transformation, in particular scaling, of the ablation area. As a result of being able to set the size and shape of the ablation area, the debonding process can be applied in particular to the materials of the substrate stack, in particular the material of the interface layer.

In a particular embodiment according to the invention, the beam shape and/or the intensity profile can be remote-controlled, in particular automatically, adjusted and controlled, in another embodiment regulated, in particular also during the debonding process. The change in the beam shape and/or the intensity profile in particular changes the laser power density in the ablation point or the ablation area.

The device according to the invention preferably comprises a laser beam shape sensor (laser beam profiler), with the aid of which the laser beam can be investigated, in particular in-situ, i.e. during the debonding process according to the invention. Typical embodiments for laser beam shape sensors are cameras, which detect the laser beam profile. The homogeneity of the laser beam can be measured quantitatively with the sensors. In a first embodiment according to the invention, the laser beam shape sensor is positioned outside the sample holder. A part of the laser beam is decoupled by optical elements and redirected into the laser beam shape sensor. In a further embodiment according to the invention, a laser beam shape sensor is incorporated in the sample holder, in particular embedded, preferably flush, in the holding surface of the sample holder.

The device according to the invention preferably comprises a laser beam energy sensor, with the aid of which the energy of the laser beam can be investigated, in particular in-situ, i.e. during the debonding process according to the invention.

Laser beam energy sensors can be constituted as laser power sensors. In a first embodiment according to the invention, the laser beam energy sensor is positioned outside the sample holder. A part of the laser beam is decoupled by optical elements and redirected into the laser beam energy sensor. In a further embodiment according to the invention, a laser beam energy sensor is incorporated in the sample holder, in particular embedded, preferably flush, in the holding surface of the sample holder.

In an embodiment according to the invention, a laser beam shape sensor and/or a laser beam energy sensor is positioned such that a part of the laser beam is decoupled by optical elements and is redirected before it can penetrate into the substrate stack. As a result of this design, it is possible according to the invention to analyse the laser beam before it penetrates or bombards the substrate stack. The measurements serve in particular as a reference or reference values.

Furthermore, a second laser beam shape sensor and/or laser beam energy sensor can be incorporated beneath the substrate stack, in particular in the sample holder. In this case, transmitted signals are analysed.

In a further embodiment according to the invention, a second laser beam shape sensor and/or laser beam energy sensor is positioned above the substrate stack, in order to measure the radiation reflected by the substrate stack, in particular by the bonding layer and/or metallisation layer of the product substrate. In this case, reflected signals are analysed.

It is also conceivable for the laser beam shape sensor and the laser beam energy sensor to be incorporated in a device.

Laser beam shape sensors and laser beam energy sensors are also denoted by the generic term laser beam sensors.

Each laser beam sensor can in particular relay its data to a control system, so that an in-situ analysis of the laser beam properties takes place. The results of the analysis of the laser beam properties can then be used for an adaptation of the laser beam. A control loop in particular is formed from the laser beam and the laser beam sensors. The analysis and control takes place in particular by means of hardware and/or firmware and/or software.

Located in or beneath the substrate holder are one or more recesses, in which light-sensitive devices are located. The light-sensitive devices are selected, according to the invention, from one or more of the following devices:

light-sensitive sensors, and in particular photodiodes,
pyroelectric sensors,
thermal sensors, in particular thermocouples or thermopiles camera, in particular CCD camera or CMOS camera The devices according to the invention in particular permit the determination of one or more of the undermentioned points:

transmittance and/or ageing of the substrate,
transmittance through the temporary bonding layer:
  ideally, no or only very little transmittance (T) takes place through the temporary bonding layer (T<0.01%) in the individual bombardment, in order to ensure the integrity of the functional substrate (device wafer).
  over 99.9% of the laser radiation is preferably absorbed in the temporary bonding layer.
  with repeated laser pulses on the same spot of the substrate stack to be separated, the temporal change in the temporary bonding layer in response to the dose can be measured. At least by analogy with the Williams-Landel-Ferry equation or with another time-temperature superposition approach, conclusions can be drawn from the temporal behaviour as to the thermal behaviour of the temporary bonding layer.
  Furthermore, the required dose for an optimised dose that protects the product substrate is determined with the aid of known statistical algorithms from the number of repeated pulses on one spot.
  Different thicknesses exhibit different transmittance, with which the extinction coefficient can be ascertained according to the Lambert-Beer's law.
  Permits, in the reference measurement for the wafer blank measurement, the determination of the carbonisation, wherein optimum process parameters prevent carbonisation which can produce undesired heat input into the product substrate.

interaction of adhesive or other materials of the bonding layer with the laser, if the laser power can be measured and represented resolved in time (temporal resolution 1 ns, or better)

measurement of the dynamics and the homogeneity with multiple exposures on one or adjacent locations in the laser writing field.

According to an improvement according to the invention, the device comprises an edge cleaning module. The edge cleaning module serves to remove the excess material (for example bonding agent), which had been used for the temporary joining of the substrates. The excess material of the bonding layer may, especially due to the bonding process, be pressed out very close to the substrate edge or over the latter and foul the outer edge regions.

The material is preferably removed before the separation of the substrate is started.

In an independent use according to the invention of the debonding method according to the invention, the laser radiation is used exclusively at an edge zone of the substrate stack in order to separate special zone-bond substrate stacks from one another, as they are referred to in particular in publication US2009/0218560 A1.

In particular, the embodiment according to the invention can also be used in such a way that complete debonding is not carried out, but rather the adhesion property remains intact at several points. This thus prevents the substrates from being able to completely fall apart and become separated from one another immediately. The substrate stack can thus still be transported, although the substrates can also be separated by minimal exertion of force.

In a further independent use according to the invention of the debonding method according to the invention and the debonding device according to the invention, the temporary bonding layer can be weakened in a locally limited manner, such that the adhesive properties remain intact especially in the edge region to an extent such that the substrate stack is separable, in particular mechanically, at a later point in time.

In a further independent use according to the invention, the transmission properties in the edge region in particular are measured when a corresponding edge layer removal is to be carried out. In particular, temporarily bonded substrates have a temporary bonding layer, which collects at the edge in the centrifugal coating process and forms an edge bead. According to the invention, this edge bead is thicker, in particular also denser. By the inventive measurement of the region in which the edge bead occurs, the exact parameters for its efficient removal can be ascertained.

This independent use of the method is referred to as debonding of tacked substrates.

The basic idea of the method according to the invention includes a measurement process, in particular a scanning measurement process, wherein a laser debonding process can in particular be carried out simultaneously.

In all the methods according to the invention, the irradiation of the interface or bonding layer can take place repeatedly. For this purpose, the scanning process is carried out repeatedly, so that the ablation area of the substrate stack is repeatedly irradiated by the laser. The number of irradiation runs over the ablation area is therefore in particular greater than 1, preferably greater than 2, still more preferably greater than 5, most preferably greater than 10, with utmost preference greater than 15.

Depending on the laser spot size and shape, the substrate stack can be bombarded with up to 10 million pulses for the debonding. The value of the pulse of an ablation area can be determined from the substrate area, the laser spot size and the number of pulses related to the overall substrate.

The multiple irradiation can in particular take place repeatedly with different laser parameters. According to the invention, a better homogenisation and a reduction of the radiation load per run can thus be achieved. A smaller radiation load protects the components that are located on the product substrate. The latter are then also subjected to a lesser degree of thermal load.

A further possibility for improving the homogeneity can take place by a shifted source of the laser beam by a fraction of a size parameter of the ablation area. The shift is in particular less than 10 times the size parameter of the ablation area, preferably less than 5 times the size parameters of the ablation area, still more preferably less than 1 time the size parameters of the ablation area, most preferably less than 0.05 times the size parameters of the ablation area, with utmost preference less than 0.01 times the size parameters of the ablation area. If the laser beam has a round ablation area, the size parameter corresponds for example to the diameter.

In other words, overlaps of the ablation areas are produced by the shifts of the source of the laser beam, so that the inhomogeneities of the laser beam are averaged out by the multiple irradiation. The multiple irradiation can be understood as an integration or an addition of the energy dose on the ablation area.

A first method according to the invention comprises the determination of the optimum laser parameters for the optimum debonding of at least two substrates from a substrate stack. It is however also conceivable for only the laser parameters of one substrate to be investigated. In this case, only one substrate instead of a substrate stack is fixed on the substrate holder. Furthermore, it is conceivable for two substrates to be investigated without an interposing temporary bonding layer and/or an interposing release layer. The transmittance of the substrate stack, in particular, can thus be ascertained. With known substrate stack properties, the properties of the temporary bonding layer can be calculated from identical measurements.

It is also conceivable for a substrate or a substrate stack to be coated with different material thicknesses of the same temporary bonding adhesive in different areas, so that measurement series for determining the properties of the layer can be carried out on a substrate. Furthermore, it is possible to use different temporary bonding adhesives and/or different material thicknesses on a substrate. This enables a rapid characterisation or optimisation of the temporary bonding adhesive or of the temporary bonding adhesives.

Optimum debonding is understood to be a separation process, wherein a complete separation of the substrates takes place in the minimum time, without destroying or damaging the substrates, in particular components on the substrates. This is ensured by the fact that the parameters are selected such that the product substrate is irradiated to the minimum possible extent. In order to ascertain these optimum laser parameters, a number of laser parameters, in particular in the form of a list or matrix, is created and stored according to the invention in a computer, preferably in software. It would be conceivable to store a laser parameter, for example the laser power in steps of 10 from 10 Watts to 1000 Watts in a list. According to the invention, ten positions are then approached with the scanner and the interface is irradiated with a laser power which corresponds to one of the stored ten values. By means of the inventive simultaneous measurement of the reflected and/or transmitted laser power, it is then possible to draw conclusions as to the laser power at which the optimum destruction of the interface and therefore the optimum debonding process takes place. The use of a list represents an optimisation of the process according to the invention on the basis of a parameter. If a plurality of parameters have to be varied, these parameters have to be stored in an n-dimensional list. The n-dimensional list can also be referred to as a matrix. The optimum parameter combination is then obtained in particular by mathematical optimisation procedures. The approaches to test planning are known to the person skilled in the art, so that the calculation instructions for the optimisation are not specified in detail as part of the method according to the invention. Conceivable laser parameters that could be investigated according to the invention are one or more of the following:

laser power
exposure time
X-Y overlapping
beam shape
pulse shape
repeated exposure
wavelength A further, second method according to the invention permits the in-situ homogenisation quantification. This is understood to mean the method of obtaining, during the debonding process, information as to the quality of the debonding, in particular at different points in the interface between the substrates. While the laser is focused on the interface in order to carry out the debonding process, in particular locally, the reflected and/or transmitted radiation is measured at the same time. The quality of the debonding at the corresponding point is determined from this. If the debonding has not been fully carried out, the point can be exposed again or at a later time in order to carry out the debonding completely. According to the invention, the quality and/or homogeneity of the debonding (separation process) in particular takes place not after the laser bombardment, but rather during the laser bombardment.

The aforementioned methods according to the invention are particularly well suited for one or more of the following temporary bonding materials:

HD 3007 (single layer)
Brewer Science Double Layer: UV active layer (release layer)
Brewer 701
Brewer Bond 305
Brewer Bond 220
JSR Laser Debond Material Double Layer (UV active layer+temporary bonding layer)
Shin Etsu organic planarization layer+temporary bonding layer
3M double layer
Fujifilm double layer
further photochemically excitable temporary bonding adhesives
further photothermally excitable temporary bonding adhesives polyimide A first method according to the invention includes one or more of the following steps:

Self-calibration of the radiation source and the measuring instruments. For this purpose, a blank measurement of the device is carried out without substrates or substrate stacks. The intensity and homogeneity of the laser source in atmosphere is detected at the sensors. The self-calibration serves to record a current actual state of all the process-relevant parameters including laboratory conditions such as temperature, relative air humidity, floating particle number.

The measurement values are processed and stored.

A non-bonded substrate stack lying one upon the other is loaded into the device.

Optionally, a non-bonded substrate stack lying one upon the other and the film used for the film fixing can be loaded into the device.

Optionally, glass substrates, in particular transparent glass substrates, lying one upon the other as a substrate stack can be loaded with or without film fixing into the device.

Optionally, a glass substrate, which constitutes a substrate stack, can be loaded into the device and measured without film fixing. A further, in particular identical glass substrate can then be loaded into the device and measured with film fixing. The absorbance and transmittance of the glass substrates of a substrate stack can thus be determined for a reference measurement without contacting the substrates.

Calibration measurement with a non-bonded substrate stack. The transmittance of the substrate stack is measured without temporary bonding adhesive.

The measurement values are processed and stored. In particular, the absorbance of the substrate stack can be calculated.

The non-bonded substrate stack is unloaded from the device.

The laser parameters are adapted in the optimum manner. The adaptation is based on empirical values and/or calculated parameters, which are stored as parameter sets in the control in a knowledge memory.

An in particular temporarily bonded substrate stack is loaded into the device.

Optionally, a temporarily bonded substrate stack, comprising a glass substrate with known and measured transmittance, a temporary bonding adhesive of known thickness and a further glass substrate with a known and measured transmittance, can be loaded into the device with or without film fixing (with no transmittance).

An in-situ measurement takes place in parallel with the debonding.

Optionally, an in-situ measurement can take place to determine the transmittance of the temporary bonding adhesive, which serves for the determination, in particular the optimisation, of the parameters.

The separated substrate stack is unloaded.

The measured values are processed and stored.

The laser parameters are again optimised.

Measurement series can be carried out to form the knowledge memory of the variations of parameters. The latter include in particular variations in:

the carrier substrate material,
the carrier substrate coating,
the carrier substrate pre-treatment, in particular plasma treatment,
the carrier substrate thickness,
the fixing film material,
the fixing film thickness,
the fixing film coating,
the material of the temporary bonding adhesive,
the thickness of the temporary bonding adhesive,
the filler materials of the temporary bonding adhesive,
the release layer thicknesses of the temporary bonding adhesive, the application method of the temporary bonding adhesive such as spraying, spin-coating, casting, squeegee.

All the known input variables with all the variations as well as all measurement results can be stored in the knowledge memory of the process, so that a rapid optimisation can take place using approaches known to the person skilled in the art.

In particular, a dose can be determined by means of a measurement series, which dose strikes the product substrate during the debonding process. The laser power and/or the layer thickness of the temporary bonding adhesive and/or the spot size of the laser beam can thus be adapted in order to prevent damage to the product substrate.

The individual measurements for a dose determination of the product substrate include:
- a transmission measurement of a first substrate, in particular a glass substrate, preferably a carrier substrate made of glass. The transmittance and/or the absorbance of the carrier substrate is determined therefrom.
- a transmission measurement of a second substrate, in particular a glass substrate, with or without a fixing film. The transmittance and/or the absorbance of the second substrate is determined therefrom.
- a transmission measurement of a substrate stack, comprising a first, measured glass substrate or glass substrate of identical specifications and a temporary bonding adhesive with known thickness and further parameters and previous history such as application method, charge, and a second glass substrate with known parameters, and optionally a fixing film with known parameters.

The absorbance and/or the transmittance of the temporary bonding adhesive can be determined from these transmission measurements.

If a substrate, in particular the second substrate, is replaced on a product substrate in the substrate stack, wherein the other substrates and parameters preferably remain very similar, preferably identical, the dose that would strike the product substrate can be calculated. If the resultant dose is smaller than the dose that damages the product substrate, the calculations can be evaluated. If the resultant dose would damage the product substrate, the parameters can be adapted on the basis of the calculations in order to be able to separate the substrate stack effectively and without damage.

In particular, optimum debonding parameters can be set with the aid of the knowledge memory, if the input variables scatter and/or are changed. In particular, the ageing of the laser source or the thickness variations in the temporary bombing adhesive or the ageing of the temporary bonding adhesive can thus be identified and compensated for by correspondingly outputted and fed-back information and/or changed parameters.

The determination of the transmittance of the substrate stack to be separated on the fixing film presupposes that the laser power is absorbed over 50%, preferably over 75%, particularly preferably over 95%, very particularly preferably over 99%, in the optimum case over 99.9%, in the ideal case over 99.99% in the temporary bonding adhesive.

All the mentioned embodiments and processes according to the invention can be combined arbitrarily with one another, but are described individually. Insofar as method features are described, the latter are also deemed to be disclosed as device features and vice versa.

Further advantages, features and details of the invention emerge from the following description of preferred examples of embodiment and with the aid of the drawings.

BRIEF DESCRIPTION OF THE DRAWINGS

Identical components or components with the same function are denoted by the same reference numbers in the figures.

DETAILED DESCRIPTION OF THE INVENTION

Figure 1A:
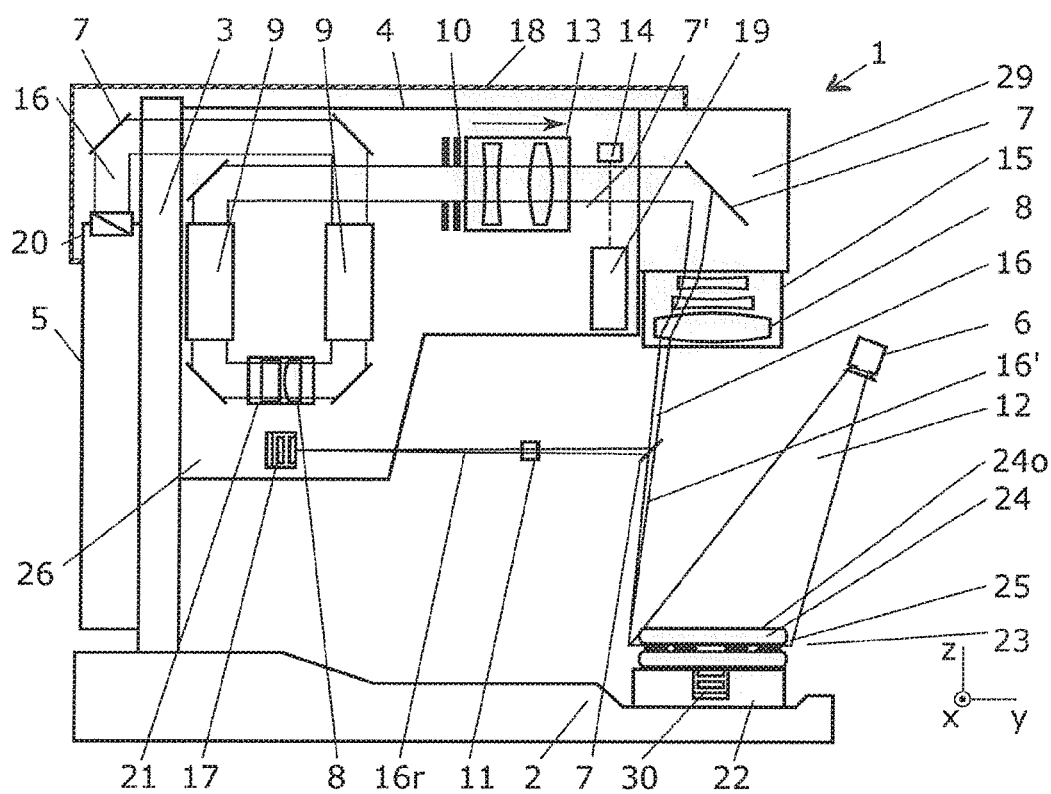
FIG. 1a shows a first embodiment of a device according to the invention in a first scanner position.

FIG. 1a shows a device 1 according to the invention for separating a temporarily bonded substrate stack 23 by bombardment of a joining layer 25 of substrate stack 23 by means of laser beams 16 emitted from an optical system 26 in the transmission mode. Device 1 comprises a base 2, with a stand 3 and optical system 26.

Optical system 26 comprises a plurality of components, in particular optical elements. Base 2 and stand 3 can be immobile with respect to one another and connected fixedly. Joining layer 25 is also referred to as bonding layer 25 and is constituted in particular as a temporary bonding layer.

The optical elements are preferably accommodated in a housing 4. Device 1 comprises a laser 5. A laser beam 16 (or a plurality of laser beams 16) generated by laser 5 is decoupled by means of a Brewster window 20 and coupled by optical elements, in particular mirrors 7, into an optical system 26. Preferably located along the path that laser beam 16 covers is at least one telescope 9 and/or a laser beam shaping unit 21 and/or at least one aperture 10 and/or a dynamic focusing unit 13 and/or semi-transparent mirrors 7' for splitting and/or deflecting laser beams 16 and/or an optical position sensor, in particular a PSD 14, and/or an auto-focusing unit 19, and in particular dynamically controllable deflection unit 29 and/or a flattening lens unit 15 with lenses 8.

The coupling of laser 5 with controllable deflection unit 29 is symbolised by a line 18. The measuring and control instruments are connected to a control computer (not represented).

In a first position of laser beam 16 deflected by deflection unit 29, at least a part of laser beam 16 is deflected by a mirror 7 into a decoupled laser beam 16r and is thus decoupled from beam path 16' remaining in the direction of the substrate stack. Decoupled laser beam 16r is relayed to a laser beam shape sensor 11 and/or a laser beam energy sensor 17. Decoupled laser beam 16r is thus measured before the remaining, non-decoupled part of laser beam 16 reaches substrate stack 23. Decoupled laser beam 16r is used to determine a reference or reference values. The remaining part of laser beam 16 can reach bonding layer 25 and at least partially separate substrate stack 23.

Substrate surface 24o and/or bonding layer 25 can be investigated and measured in each device 1, 1' according to the invention by a camera 6 in a visual range 12. Camera 6 is in particular an infrared camera. If substrates 24 are transparent for visible light, it is preferably a camera which is sensitive in the visible wavelength region.

Substrate holder 22 is movable in particular in the x- and/or y- and/or z-direction. The movement in the z-direction can in particular serve to change the position of the depth of focus and/or can be used for a loading and/or unloading sequence of the device. The depth of focus is preferably changed by an adaptation of the focusing of the laser beam. The loading and/or unloading can in particular also take place with the aid of loading pins, which are incorporated in the substrate holder.

According to a first embodiment according to the invention, substrate stack 23 is transported into a focal plane of laser beam 16' and fixed, in particular clamped, for the debonding process, so that substrate stack 23 occupies a defined position on substrate holder 22 and does not change it.

Substrate stack 23 is preferably brought on a carrier into the device according to the invention. In this case, the carrier is preferably connected to the product substrate of substrate stack 23.

In a very particular procedure, substrate stack 23 is fixed on a film (tape), which is stretched over a frame. Substrate stack 23 is connected via the product substrate to the film. Substrate stack 23 can thus easily be transported. As a result of the use of such fixing, the generally relatively thin product substrate remains, after removal of the carrier substrate, on the film and can be removed without problem from the installation according to the invention.

It is also conceivable for substrate stack 23 to be treated by the device according to the invention without a carrier. In this case, the product substrate should however have a sufficient thickness (rigidity) in order to be sufficiently dimensionally stable.

According to an embodiment, wherein no carrier is used, the substrate holder is designed in particular such that, after the removal of the carrier substrate from the substrate stack, said substrate holder can sufficiently fix and stabilise the product substrate. In such an embodiment of a device according to the invention, rolling-up of the product substrate after the debonding is prevented in particular by adapted fixing elements for product substrates. In particular, it may be necessary for the product substrate thus fixed to be fixed on another carrier by means of a carrier exchange (carrier flip flop) before it is removed from the substrate holder.

The bombardment of substrate stack 23 with laser beam 16' takes place by scanning in particular a predominant part, preferably the whole of bonding layer 25 by means of scanning movements. The scanning movements are carried out in particular by means of deflection unit 29 as a relative movement between laser beam 16' and substrate stack 23.

As an alternative to this (or in addition), the position of the depth of focus can be changed by means of a telescope 9.

In a further embodiment, the scanning can take place by a relative movement, in particular an active movement of substrate holder 22 with respect to optical system 26.

The scanning movement of laser beam 16' can comprise different trajectories and/or paths described above, with the aim of bombarding substrate stack 23, in particular joining layer 25, at least predominantly, preferably completely, but at the same time causing as little damage as possible thereto.

It is irrelevant for the scanning movement whether laser beam 16' and/or substrate stack 23 and/or substrate holder 22 performs the scanning, so that the following embodiments are disclosed as being according to the invention:
  stationary laser beam 16' and moved substrate stack 23, or
  stationary substrate stack 23 and moved laser beam 16', or
  moved laser beam 16' and moved substrate stack 23.

A stationary laser beam 16' (or stationary group of laser beams) and a stationary substrate stack as a one-off, i.e. full-area scan, without movement during the bombardment is also disclosed as being according to the invention.

In an embodiment of device 1, 1' according to the invention, laser beam sensor 30 can be positioned beside the substrate in the plane of the temporary bonding adhesive, not masked by substrate stack 23. This embodiment is not depicted.

In an alternative embodiment of device 1, 1' according to the invention, laser beam sensor 30 can, as represented diagrammatically, be constituted in particular as a partial area of substrate holder 22, wherein the positioning can take place either (preferably) concentrically or non-concentrically.

A sensor area of laser beam sensor 30 arranged in particular parallel to and/or aligned with substrate surface 23o can occupy more than 0.001%, preferably more than 0.005%, particularly preferably more than 0.01%, still more preferably more than 0.05%, most preferably more than 0.1% of the entire area of substrate carrier 22.

In a third embodiment (not represented) of device 1, 1' according to the invention, more than 1, preferably more than 2, particularly preferably more than 5 laser beam sensors 30 can be incorporated in substrate holder 22, in particular distributed at substrate surface 23o. The scaling of the entire area of the substrate holder with respect to the sensor area can be different from the second embodiment.

In a fourth embodiment (not represented) of device 1, 1' according to the invention, at least one laser beam sensor 30 can be constituted as a surface-area sensor, so that more than 50% of the substrate stack area, preferably more than 60% of the substrate stack area, particularly preferably more than 80% of the substrate stack area, very particularly preferably more than 99% of the substrate stack area can be measured, in particular in-situ, during the debonding.

Figure 1B:
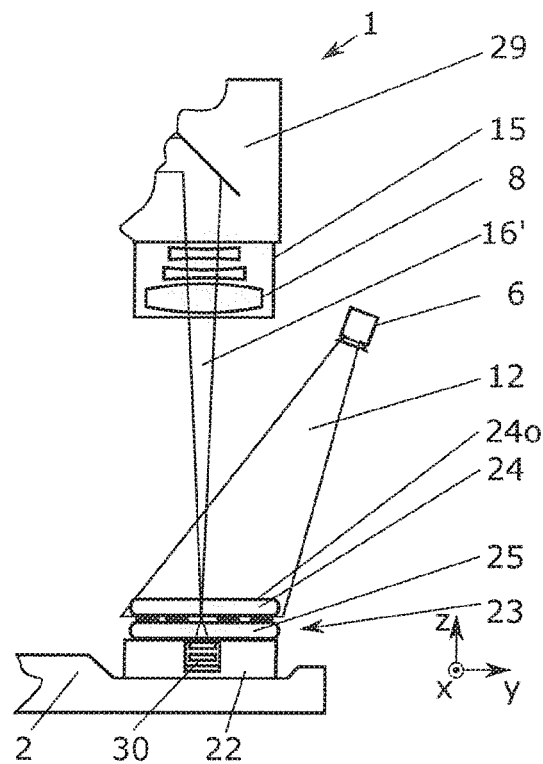
FIG. 1b shows the first embodiment according to FIG. 1a in a second scanner position.

FIG. 1b shows a detail of an inventive device 1 according to the embodiment of FIG. 1a. Deflection unit 29 has deflected laser beam 16' into a further beam position. Laser beam 16' strikes through substrate stack 23 in this beam position onto laser beam sensor 30. The measurement of the remaining part of laser beam 16' after reflection and/or transmission at/through substrate stack 23, in particular bonding layer 25, takes place in particular by means of laser beam sensor 30, which both as a laser beam energy sensor 17 and also as a laser beam shape sensor 11 and also as an integrated sensor is suitable for the measurement of the energy of the laser beam as well as the shape of the laser beam. This device 1 according to the invention, therefore, is a device 1 for transmission measurement.

Figure 1C:
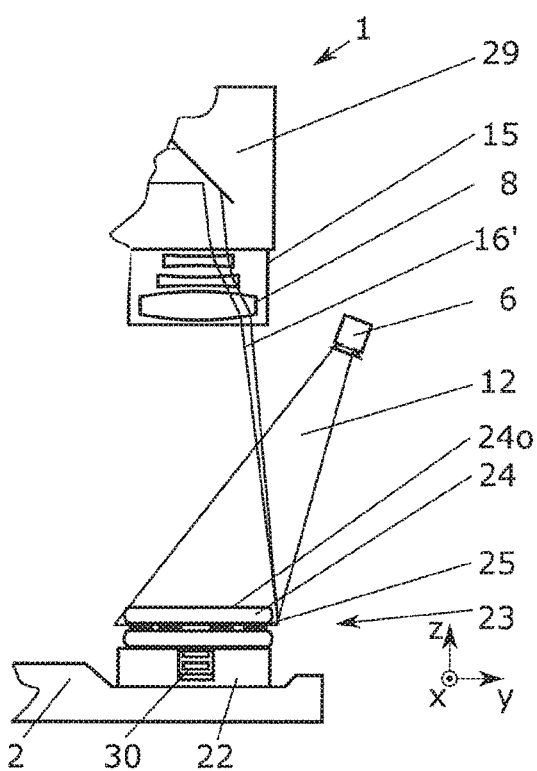
FIG. 1c shows the first embodiment according to FIG. 1a in a third scanner position.

FIG. 1c shows a part of a device 1 according to the invention, as is described in FIG. 1a. Deflection unit 29 has deflected laser beam 16' into a further represented beam position. Laser beam 16' strikes substrate holder 22 through substrate stack 23. Full-area scanning of bonding layer 25 is thus possible.

Figure 2:
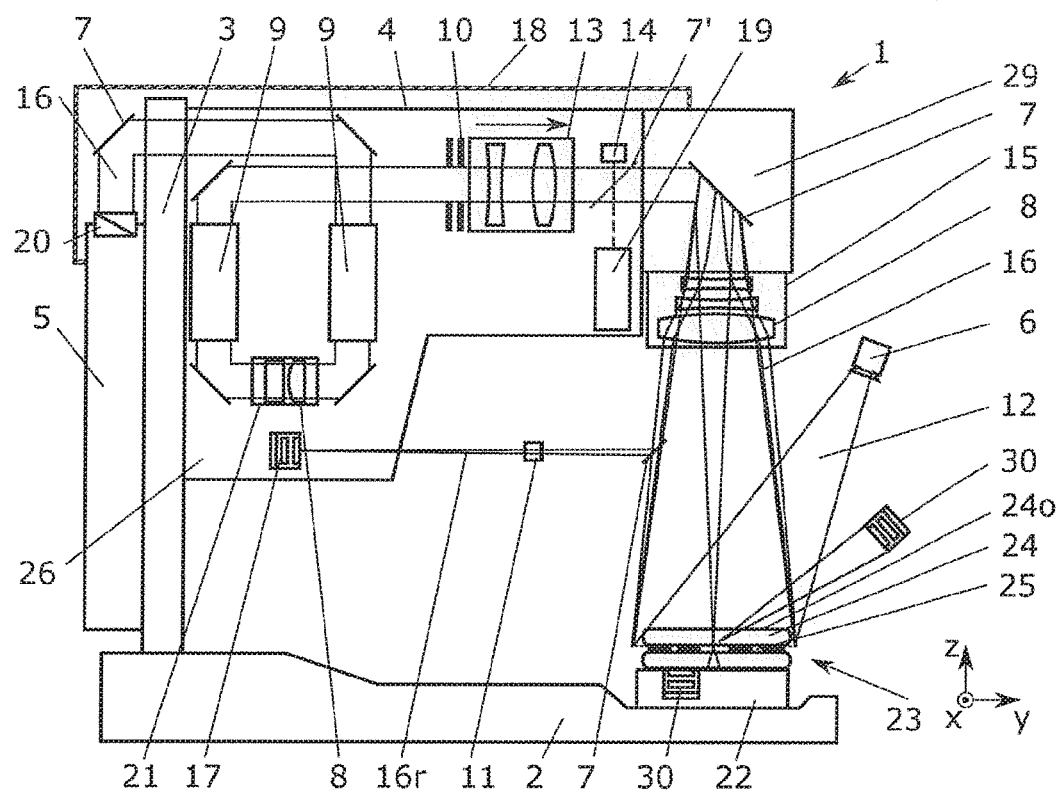
FIG. 2 shows a second embodiment of the device according to the invention.

FIG. 2 shows a device 1' according to the invention in the reflection mode, i.e. with a reflection measurement instead of or in addition to a transmission measurement. In contrast with device 1, a laser beam shape sensor (not shown) and/or a laser beam energy sensor (not shown) is located above substrate stack 23 and measures the radiation reflected by bonding layer 25.

In each device 1, 1' according to the invention, substrate surface 24o and/or bonding layer 25 can be investigated and measured by means of a camera 6 with a visual range 12. Camera 6 is in particular an infrared camera, preferably a camera which can detect IR and visible light simultaneously. Camera 6 is matched both to the transparency of substrate stack 23 and also to the employed laser radiation, so that the release process can be observed with optical means.

Substrate holder 22 can be moved in particular in the x- and/or y- and/or z-direction. The movement in the z-direction can in particular serve to change the position of the depth of focus and/or be used for the loading and/or unloading sequence of the device.

In a first embodiment according to the invention, substrate stack 23 is transported into a focal plane of laser beam 16' and clamped for the debonding process, such that substrate stack 23 occupies a position on substrate holder 22 and does not change it. The scanning movements are carried out in particular by means of deflection unit 29 as a relative movement between laser beam 16 and the substrate stack.

As an alternative to this (or an addition), the position of the depth of focus can be changed by means of a telescope 9. The relative movement, in particular the active movement of substrate holder 22 with respect to optical system 26, permits scanning of entire bonding layer 25.

As an alternative to this (or in addition), the position of the depth of focus can be changed by means of a telescope 9.

In a further embodiment, a relative movement, in particular the active movement of substrate holder 22 with respect to optical system 26, can achieve scanning of entire bonding layer 25.

In an embodiment (not represented) of device 1, 1' according to the invention, it is possible for device 1, 1' to comprise a laser beam sensor 30 for reflective measurements, but no laser beam sensor 30 for transmission measurements. This device 1, 1' can be used when use is made of a non-transparent product substrate.

In the representation of FIG. 2 in device 1, 1' according to the invention, three dedicated beam paths of laser beam 16 are shown simultaneously, wherein two edge beams and a central beam are represented. In a first embodiment according to the invention, this serves merely to illustrate edge positions of an individual laser beam 16, which can simultaneously process a spot on the substrate.

In a further (not represented) embodiment of device 1, 1' according to the invention, it is possible, by means of suitable adaptations (beam splitter, a plurality of laser sources) of laser beam 16 and deflection unit 29, to use simultaneously a plurality of laser beams in parallel, in particular massively parallel, for the debonding.

Figure 3:
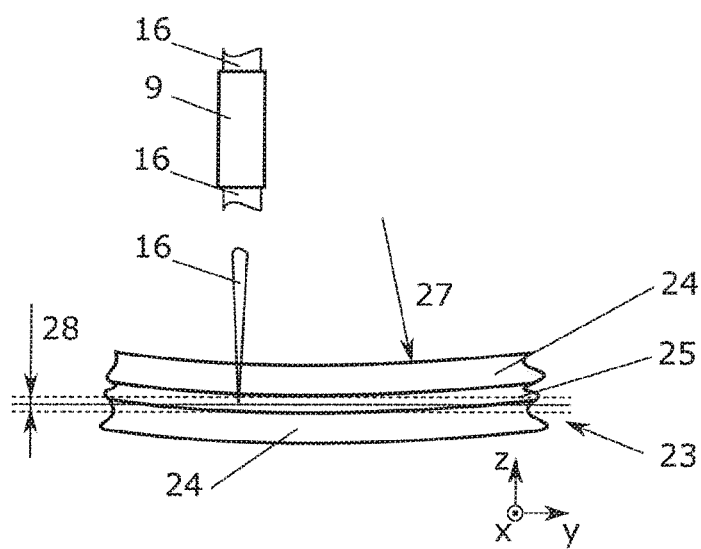
FIG. 3 shows an enlarged partial view of the device according to the invention.

FIG. 3 shows an enlarged cross-sectional representation of a substrate stack 23, comprising two substrates 24 and a bonding layer 25. Focused laser beam 16, at the respective x-y position, has a finite depth of focus range 28 in the z-direction. Substrate stack 23 has a slight curvature with a curvature radius 27. In order to be able to align depth of focus range 28 at each x-y position exactly on bonding layer 25, the z-position of depth of focus range 28 is preferably adjustable. The adjustment takes place by means of at least one of the optical elements, preferably by means of at least one of telescopes 9, which are located in the beam path of laser beam 16. FIG. 3 shows one of telescopes 9 by way of example as an upstream optical element. Depth of focus range 28 in the z-direction is in particular thinner than substrate stack 23. The depth of focus range is preferably smaller than the layer thickness of the adhesive, particularly preferably <0.5 times the thickness of the adhesive.

LIST OF REFERENCE NUMBERS 1 device
2 base
3 stand
4 housing
5 laser
6 camera
7 mirror
7' partially transparent mirror
8 lens
9 telescope
10 aperture
11, 11' laser beam shape sensor
12 visual range
13 dynamic focusing unit
14 PSD (position sensitive device)
15 flattening lens unit (field flattening unit)
16 laser beam
16' laser beam
16r decoupled laser beam
17, 17' laser beam energy sensor
18 line
19 auto-focusing unit
20 Brewster window
21 laser beam shaping unit
22 substrate holder
23 substrate stack
24 substrate
24o substrate surface
25 joining layer/bonding layer
26 optical system
27 curvature radius
28 depth of field range
29 deflection unit
30 laser beam sensor

What is claimed is:

1. A method for separating a temporarily bonded substrate stack, said method comprising:
   bombarding a joining layer of the temporarily bonded substrate stack by means of laser beams emitted by a laser, the bombarding comprising illuminating a plurality of positions of the joining layer with the laser beams;
   detecting the laser beams of the laser that are reflected and/or transmitted at the temporarily bonded substrate stack during the bombarding of the joining layer with the laser beams, the detecting comprising:
   measuring the reflected and/or transmitted laser beams; and
   determining a power of the laser that is optimal for the bombarding of the joining layer;
   monitoring and/or adapting parameters of the laser during the bombarding of the joining layer; and
   aligning depth of focus range at each x-y position exactly on the joining layer by adjusting a z-position of the depth of focus range via one or more telescopes respectively located in paths of the laser beams.

2. The method according to claim 1, wherein the detecting the laser beams of the laser that are reflected and/or transmitted at the temporarily bonded substrate stack takes place before and during the bombarding of the joining layer.

3. The method according to claim 1, further comprising:
   controlling a beam shape and/or an intensity profile of the laser beams by means of the detected laser beams.

4. The method according to claim 1, wherein the bombarding of the joining layer takes place in a scanned manner with the laser beams.

5. The method according to claim 1, further comprising:
evaluating the detected laser beams to control a process for separating the temporarily bonded substrate stack.

6. A device for separating a temporarily bonded substrate stack, said device comprising:
bombarding means for bombardment of a joining layer of the temporarily bonded substrate stack by means of laser beams emitted by a laser by illuminating a plurality of positions of the joining layer with the laser beams;
detection means for detecting the laser beams of the laser that are reflected and/or transmitted at the temporarily bonded substrate stack and/or a reference substrate stack by measuring the reflected and/or transmitted laser beams and determining a power of the laser that is optimal for the bombarding of the joining layer; and
one or more telescopes respectively located in paths of the laser beams, the telescopes being configured to align depth of focus range at each x-y position exactly on the joining layer by adjusting a z-position of the depth of focus range,
wherein monitoring and/or adaptation of parameters of the laser takes place during the bombardment of the joining layer.

7. The device according to claim 6, wherein the detection means detects the laser beams of the laser reflected and/or transmitted at the temporarily bonded substrate stack before and during the bombardment of the joining layer.

8. The device according to claim 6, further comprising:
a control device for controlling a beam shape and/or an intensity profile of the laser beams by means of the detected laser beams.

9. The device according to claim 6, further comprising:
a base;
a stand;
an optical system for influencing beam shape and/or beam direction of the laser beams; and
a substrate holder for accommodating and fixing the temporarily bonded substrate stack, the substrate holder being configured to move the substrate stack relative to the laser beams.

10. The device according to claim 7, further comprising:
a control device for controlling a beam shape and/or an intensity profile of the laser beams by means of the detected laser beams.

* * * * *